US011310930B2

(12) United States Patent
Choi et al.

(10) Patent No.: US 11,310,930 B2
(45) Date of Patent: Apr. 19, 2022

(54) ELECTRONIC DEVICE HAVING WATERPROOF STRUCTURE

(71) Applicant: Samsung Electronics Co., Ltd., Suwon-si (KR)

(72) Inventors: Byoung Hee Choi, Suwon-si (KR); Jin Ho Lee, Suwon-si (KR); Young Soo Jang, Suwon-si (KR); Yun Sung Ha, Suwon-si (KR); Yong Wook Hwang, Suwon-si (KR); Jung Hyeon Hwang, Suwon-si (KR); Chang Youn Hwang, Suwon-si (KR); Hyeon Woo Lee, Suwon-si (KR); Chong Kun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 16/754,891

(22) PCT Filed: Nov. 8, 2018

(86) PCT No.: PCT/KR2018/013527
§ 371 (c)(1),
(2) Date: Apr. 9, 2020

(87) PCT Pub. No.: WO2019/093782
PCT Pub. Date: May 16, 2019

(65) Prior Publication Data
US 2021/0204435 A1    Jul. 1, 2021

(30) Foreign Application Priority Data

Nov. 13, 2017   (KR) .................. 10-2017-0150578

(51) Int. Cl.
*H05K 5/06* (2006.01)
*G06F 1/16* (2006.01)
(Continued)

(52) U.S. Cl.
CPC ............. *H05K 5/06* (2013.01); *G06F 1/1626* (2013.01); *G06F 1/1658* (2013.01); *H05K 5/04* (2013.01);
(Continued)

(58) Field of Classification Search
CPC .... G06F 1/1601; G06F 1/1626; G06F 1/1658; H05K 5/06; H05K 5/04; H04B 1/3827; H04M 1/0266
See application file for complete search history.

(56) References Cited

U.S. PATENT DOCUMENTS 8,531,834 B2 *   9/2013   Rayner ................ H04B 1/3888
                                                361/679.56
9,337,882 B2 *   5/2016   Song .................... H04M 1/0254
(Continued)

FOREIGN PATENT DOCUMENTS

EP              3 396 931 A1      10/2018
KR      10-2016-0105049 A          9/2016
(Continued)

OTHER PUBLICATIONS

Extended European Search Report dated Nov. 5, 2020, issued in European Patent Application No. 18876754.5.
(Continued)

*Primary Examiner* — Hung S. Bui
*Assistant Examiner* — Sagar Shrestha
(74) *Attorney, Agent, or Firm* — Jefferson IP Law, LLP

(57) ABSTRACT

An electronic device according to an embodiment of the present invention comprises a front plate, a back plate facing a direction opposite to the front plate, a side member surrounding a space between the front plate and the back plate, constructed integrally with respect to the back plate, or bonded to the back plate, wherein the side member includes an outer structure constructed of a first metallic material and
(Continued)

including at least one first surface constructing an outer surface of the side member and at least one second surface facing the space, an inner structure constructed of a second metallic material different from the first metallic material and including at least one third surface at least partially in contact with the second surface and at least one fourth surface facing the space, a touch screen display exposed through the front plate, an internal structure disposed to the space so as to be adjacent to the side member, constructed of a first polymer material, and including at least one fifth surface at least partially in contact with the second surface, a wireless communication circuit electrically coupled with a portion of the inner structure, and a sealant disposed between the fourth surface and at least one sixth surface of the internal structure. Other examples are also possible.

20 Claims, 15 Drawing Sheets

(51) Int. Cl.
  *H05K 5/04* (2006.01)
  *H04B 1/3827* (2015.01)
  *H04M 1/02* (2006.01)
(52) U.S. Cl.
  CPC ......... *H04B 1/3827* (2013.01); *H04M 1/0266* (2013.01)

(56) References Cited

U.S. PATENT DOCUMENTS

| | | | | |
|---|---|---|---|---|
| 9,354,732 | B2* | 5/2016 | An | G02F 1/133308 |
| 9,405,318 | B2* | 8/2016 | Morioka | H04M 1/18 |
| 9,513,668 | B2* | 12/2016 | Shin | H04M 1/0202 |
| 9,706,024 | B2* | 7/2017 | Shimoda | G09F 9/00 |
| 9,831,905 | B1* | 11/2017 | Flores | H05K 5/0017 |
| 10,019,029 | B1* | 7/2018 | Yu | B29C 45/1671 |
| 10,182,134 | B2* | 1/2019 | Lim | G06F 1/1684 |
| 10,509,439 | B2* | 12/2019 | Choi | G06F 1/1652 |
| 10,521,040 | B2* | 12/2019 | Lin | G06F 3/0412 |
| 2007/0171215 | A1* | 7/2007 | Song | G02B 6/0083 |
| | | | | 345/204 |
| 2013/0027892 | A1* | 1/2013 | Lim | H04M 1/0283 |
| | | | | 361/748 |
| 2013/0242481 | A1* | 9/2013 | Kim | H04B 1/3888 |
| | | | | 361/679.01 |
| 2014/0031093 | A1* | 1/2014 | Song | H04M 1/0254 |
| | | | | 455/575.1 |
| 2015/0049434 | A1* | 2/2015 | Sato | G06F 1/1626 |
| | | | | 361/679.56 |
| 2015/0064966 | A1* | 3/2015 | Chuang | H01R 13/516 |
| | | | | 439/571 |
| 2015/0091418 | A1* | 4/2015 | Chung | H04M 1/0249 |
| | | | | 312/223.1 |
| 2015/0109170 | A1* | 4/2015 | Kang | H05K 5/04 |
| | | | | 343/702 |
| 2015/0155614 | A1* | 6/2015 | Youn | G06F 1/1656 |
| | | | | 343/702 |
| 2015/0261033 | A1* | 9/2015 | Shin | G06F 1/1656 |
| | | | | 349/58 |
| 2015/0277501 | A1* | 10/2015 | Sugiyama | G06F 1/1656 |
| | | | | 361/679.57 |
| 2015/0331451 | A1* | 11/2015 | Shin | H04M 1/0283 |
| | | | | 345/173 |
| 2016/0062391 | A1* | 3/2016 | Choi | H04M 1/0266 |
| | | | | 361/679.03 |
| 2016/0253015 | A1 | 9/2016 | Kim et al. | |
| 2017/0012659 | A1* | 1/2017 | Kim | H04B 1/3888 |
| 2017/0054836 | A1* | 2/2017 | Chung | H04B 1/3833 |
| 2017/0099742 | A1 | 4/2017 | Choi et al. | |
| 2017/0111077 | A1 | 4/2017 | Hwang et al. | |
| 2017/0135239 | A1 | 5/2017 | Hyun et al. | |
| 2018/0070465 | A1* | 3/2018 | Cater | H01Q 1/521 |
| 2020/0201386 | A1 | 6/2020 | Hwang et al. | |

FOREIGN PATENT DOCUMENTS

| | | |
|---|---|---|
| KR | 10-2016-0115306 A | 10/2016 |
| KR | 10-2017-0040082 A | 4/2017 |
| KR | 10-2017-0044527 A | 4/2017 |
| KR | 10-2017-0092794 A | 8/2017 |

OTHER PUBLICATIONS

Indian Office Action dated Jun. 21, 2021, issued in Indian Patent Application No. 202017020626.

* cited by examiner

ELECTRONIC DEVICE HAVING WATERPROOF STRUCTURE

CROSS-REFERENCE TO RELATED APPLICATION(S)

This application is a U.S. National Stage application under 35 U.S.C. § 371 of an International application number PCT/KR2018/013527, filed on Nov. 8, 2018, which is based on and claimed priority of a Korean patent application number 10-2017-0150578, filed on Nov. 13, 2017, in the Korean Intellectual Property Office, the disclosure of which is incorporated by reference herein in its entirety.

TECHNICAL FIELD

Various embodiments of the present disclosure relate to an electronic device having a waterproof structure.

BACKGROUND ART

With the development of digital technologies, electronic devices are provided in various forms, such as a smart phone, a tablet Personal Computer (PC), a Personal Digital Assistant (PDA), or the like. The electronic device is also developed such that it is worn by a user to improve portability and user accessibility.

An exterior of the electronic device may be constructed due to bonding of a metallic outer member and a non-metallic member. The electronic device including the metallic outer member may provide a metal-specific luxurious design. Since a metallic material included in the metallic outer member also has effect on durability, the electronic device to which the metallic outer member is applied is becoming more popular.

DISCLOSURE OF INVENTION

Technical Problem

The metallic outer member may be constructed of a metallic material having a property capable of being stably joined to a non-metallic member such as resin. When the metallic outer member and the non-metallic member are stably joined, an interface between the metallic outer member and the non-metallic member may not be separated by an impact caused by a drop or the like but be capable of withstanding it. However, when the metallic outer member is constructed of a metallic material having a corrosion resistance property and an aesthetic property in design, it may be difficult to secure stable joining force (or bonding force) between the metallic outer member and the non-metallic member due to a material property thereof. When the interface between the metallic outer member and the non-metallic member is separated, a foreign matter such as water or the like may be introduced into the electronic device through a gap between the metallic outer member and the non-metallic member.

Various embodiments of the present disclosure may provide an electronic device having a waterproof structure for ensuring waterproof performance when it is difficult to stably join a metallic outer member and a non-metallic member.

Solution to Problem

According to an embodiment of the present disclosure, an electronic device may include a front plate, a back plate facing a direction opposite to the front plate, a side member surrounding a space between the front plate and the back plate, constructed integrally with respect to the back plate, or bonded to the back plate, wherein the side member includes an outer structure constructed of a first metallic material and including at least one first surface constructing an outer surface of the side member and at least one second surface facing the space, an inner structure constructed of a second metallic material different from the first metallic material and including at least one third surface at least partially in contact with the second surface and at least one fourth surface facing the space, a touch screen display exposed through the front plate, an internal structure disposed to the space so as to be adjacent to the side member, constructed of a first polymer material, and including at least one fifth surface at least partially in contact with the second surface, a wireless communication circuit electrically coupled with a portion of the inner structure, and a sealant disposed between the fourth surface and at least one sixth surface of the internal structure.

According to an embodiment of the present disclosure, an electronic device may include a front plate, a back plate facing a direction opposite to the front plate, an outer structure surrounding a space between the front plate and the back plate, and including a plurality of first gaps and a plurality of portions physically separated by the first gaps, an inner structure disposed to the space according to the outer structure, and including second gaps aligned with the first gaps and a plurality of portions physically separated by the second gaps, a non-metallic internal structure bonded with the inner structure in the space, and including the first gaps and a portion disposed to the second gaps to constitute an outer surface of the electronic device, an organic adhesive layer disposed between the inner structure and the internal structure, and a display disposed to the space and exposed through the front plate. The outer structure and the inner structure may be constructed of different metallic materials.

Advantageous Effects of Invention

According to various embodiments of the present disclosure, a metallic outer member is allowed to include an outer structure of a first metallic material and an inner structure of a second metallic material different from the first metallic material, and is designed to have bonding force between the inner structure and an internal structure of a non-metal material, thereby ensuring waterproof performance.

BEST MODE FOR CARRYING OUT THE INVENTION

Figure 1A:
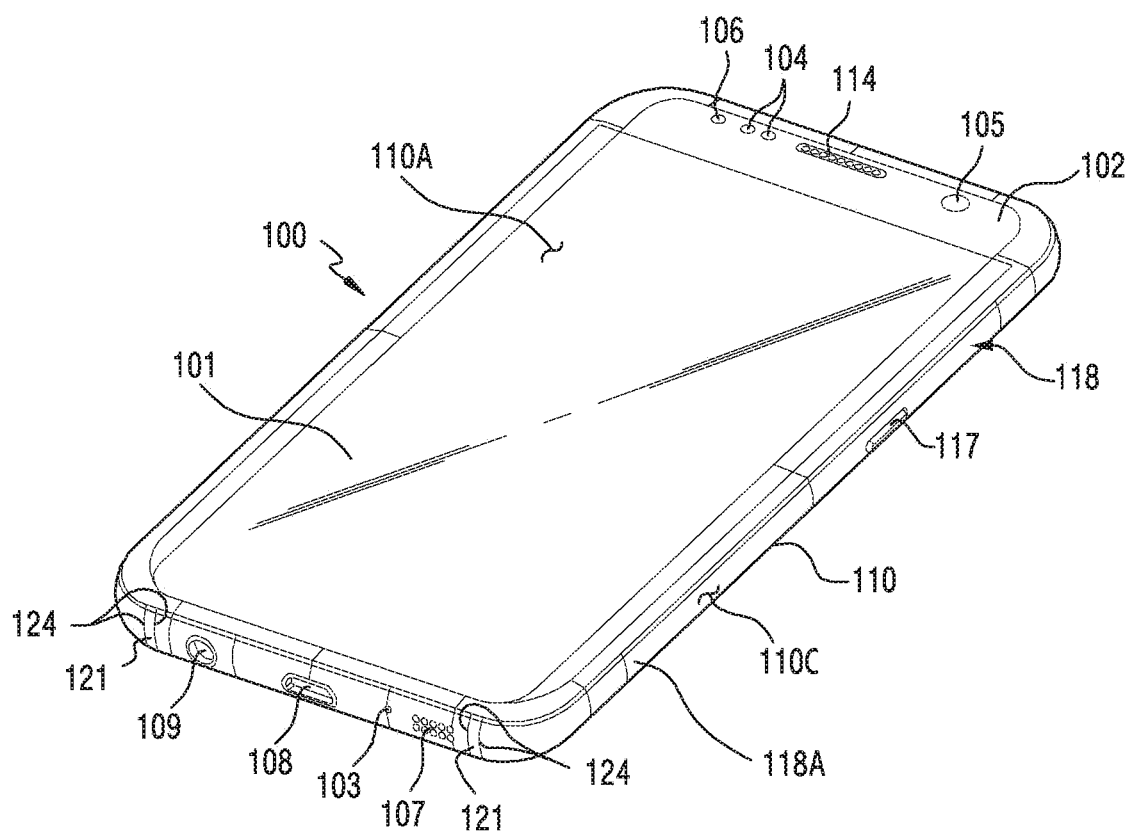
FIG. 1A is a front perspective view of an electronic device having a waterproof structure according to an embodiment.

Hereinafter, various embodiments of the present document are described with reference to the accompanying drawings. It should be understood, however, that it is not intended to limit the various embodiments of the present document to the particular form disclosed, but, on the contrary, it is intended to cover all modifications, equivalents, and alternatives falling within the spirit and scope of the various embodiments of the present document. Like reference numerals denote like components throughout the drawings. A singular expression includes a plural concept unless there is a contextually distinctive difference therebetween. In the present document, an expression "A or B", "A and/or B", or the like may include all possible combinations of items enumerated together. Although expressions such as "first", and "second" may be used to express corresponding components, it is not intended to limit the corresponding components. When a certain (e.g., $1^{st}$) component is mentioned as being "operatively or communicatively coupled with/to" or "connected to" a different (e.g., $2^{nd}$) component, the certain component is directly coupled with/to another component or can be coupled with/to the different component via another (e.g., $3^{rd}$) component.

An expression "configured to" used in the present document may be interchangeably used with, for example, "suitable for", "having the capacity to", "adapted to", "made to", "capable of", or "designed to" in a hardware or software manner according to a situation. In a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor) capable of performing corresponding operations by executing one or more software programs stored in a memory device.

The electronic devices according to various embodiments disclosed in the present document may be various types of devices. The electronic device may include, for example, at least one of a portable communication device (e.g., a smart phone), a computer device, a portable multimedia device, a portable medical device, a camera, a wearable device, and a home appliance. The electronic device according to an embodiment of the present document is not limited to the aforementioned devices.

In various embodiments, the wearable device may include at least one of an accessory-type device (e.g., a watch, a ring, a bracelet, an anklet, a necklace, glasses, contact lenses, or a Head-Mounted Device (HMD)), a fabric- or clothes-integrated device (e.g., electronic clothes), a body attaching-type device (e.g., a skin pad or tattoo), or a body implantable device (e.g., an implantable circuit). According to some embodiments, the electronic device may include, for example, at least one of a TeleVision (TV), a Digital Video Disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, and an electronic picture frame.

According to various embodiments, the electronic device may include at least one of various medical devices (e.g., various portable medical measuring devices (e.g., a blood sugar measuring device, a hear rate measuring device, a blood pressure measuring device, a body temperature measuring device, etc.), Magnetic Resonance Angiography (MRA), Magnetic Resonance Imaging (MRI), Computed Tomography (CT), imaging equipment, ultrasonic instrument, etc.)), a navigation device, a Global Positioning System (GPS) receiver, an Event Data Recorder (EDR), a Flight Data Recorder (FDR), a car infotainment device, an electronic equipment for ship (e.g., a vessel navigation device, a gyro compass, etc.), avionics, a security device, a car head unit, an industrial or domestic robot, a drone, an Automatic Teller's Machine (ATM) of financial institutions, Point Of Sales (POS) of shops, and internet of things (e.g., a light bulb, various sensors, an electric or gas meter, a sprinkler device, a fire alarm, a thermostat, a streetlamp, a toaster, a fitness equipment, a hot water tank, a heater, a boiler, etc.). According to some embodiments, the electronic device may include at least one of part of furniture, buildings/constructions or cars, an electronic board, an electronic signature receiving device, a projector, and various measurement machines (e.g., water supply, electricity, gas, propagation measurement machine, etc.). The electronic device according to various embodiments may be flexible, or may be a combination of two or more of the aforementioned various devices. The electronic device according to an embodiment of the present document is not limited to the aforementioned devices. The term 'user' used in the present document may refer to a person who uses the electronic device or a device (e.g., an Artificial Intelligence (AI) electronic device) which uses the electronic device.

Figure 1B:
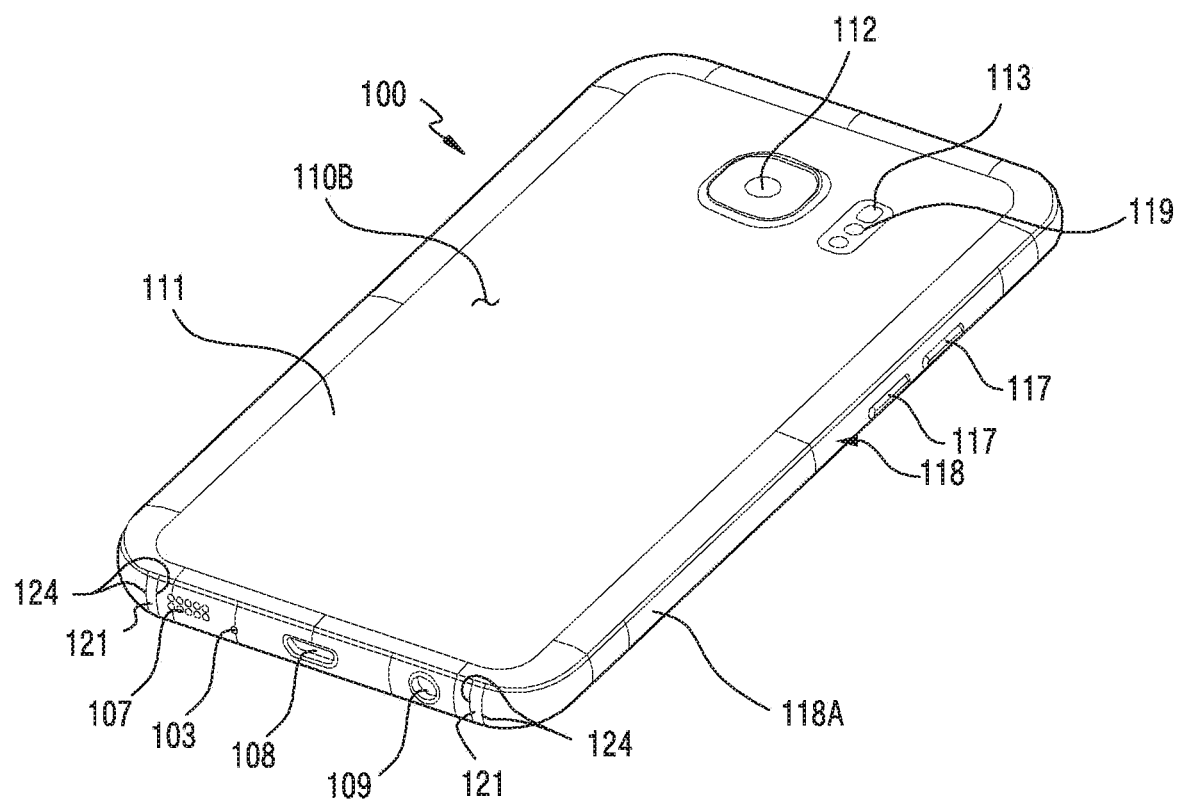
FIG. 1B is a rear perspective view of an electronic device having a waterproof structure of FIG. 1A according to an embodiment.
Figure 2:
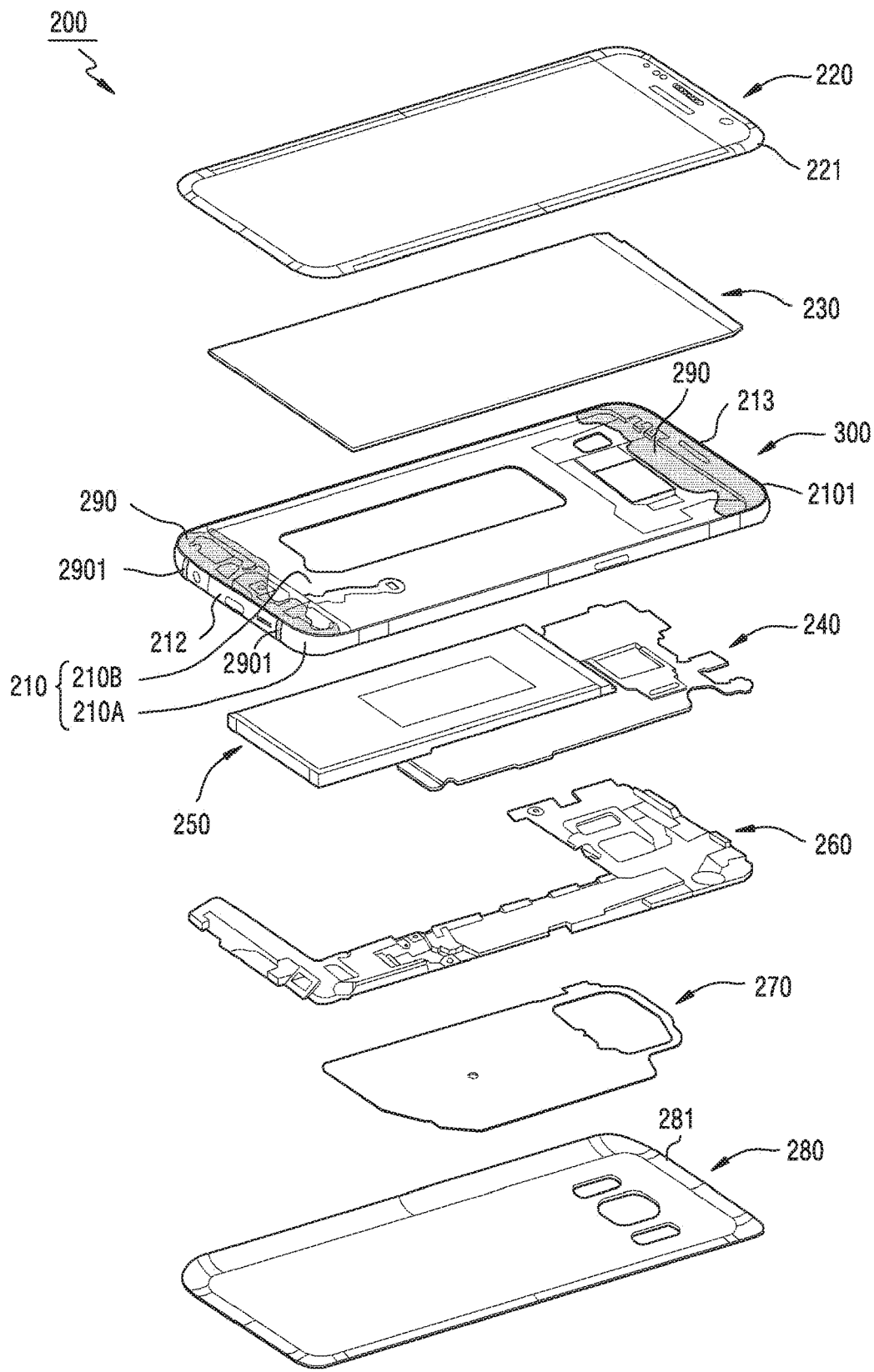
FIG. 2 is an exploded perspective view of an electronic device having a waterproof structure according to an embodiment.
Figure 3:
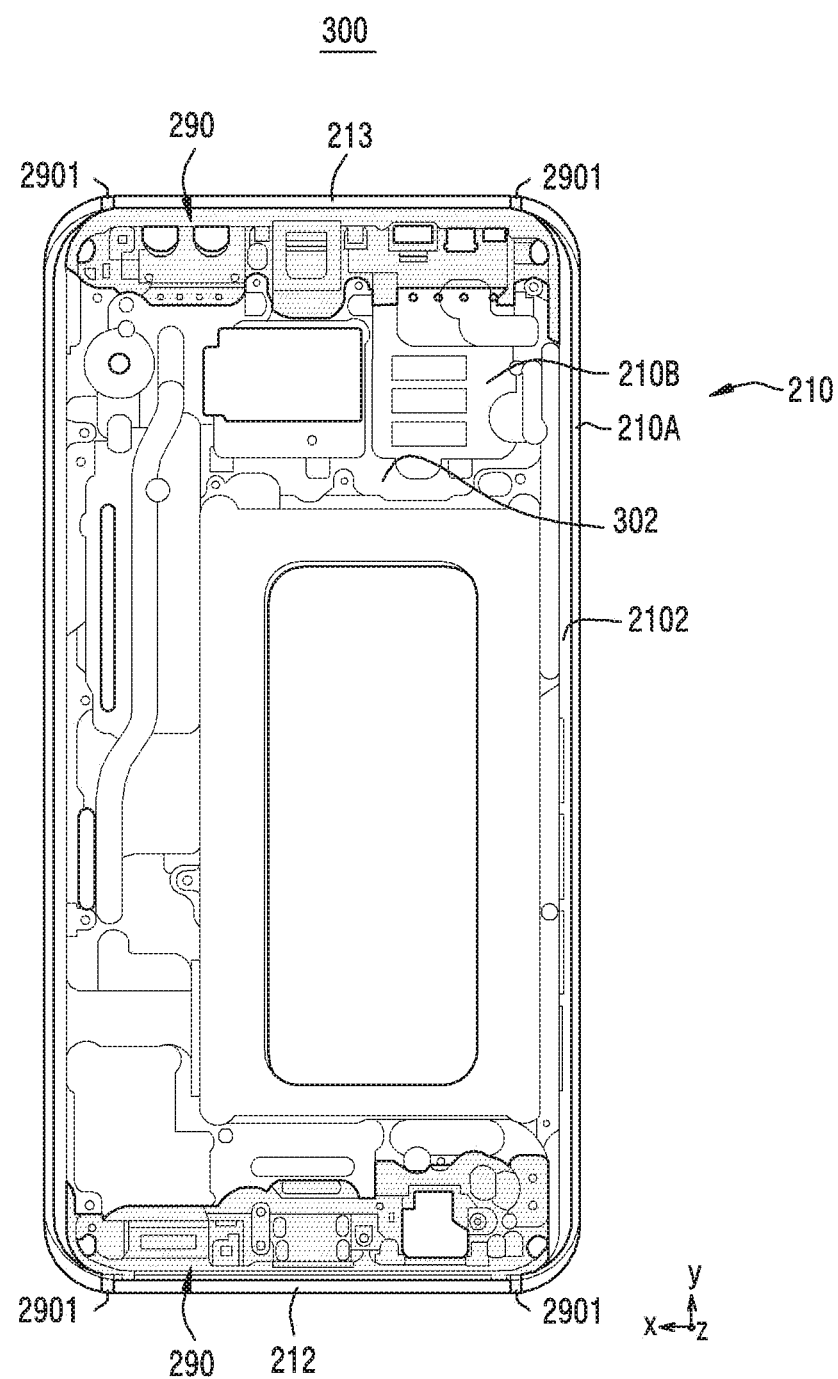
FIG. 3 illustrates a first support member constructed of a side bezel structure and an internal structure according to an embodiment.

FIG. 1A is a front perspective view of an electronic device having a waterproof structure according to an embodiment. FIG. 1B is a rear perspective view of the electronic device having the waterproof structure of FIG. 1A according to an embodiment. FIG. 2 is an exploded perspective view of an electronic device having a waterproof structure according to an embodiment. FIG. 3 is a perspective view of a support member according to an embodiment.

Referring to FIG. 1A and FIG. 1B, an electronic device 100 according to an embodiment may include a housing 110 including a first surface (or a front surface) 110A, a second surface (or a back surface) 110B, and a side surface 110C surrounding a space between the first surface 100A and the second surface 110B. In another embodiment (not shown), the housing may refer to a structure which constitutes part of the first surface 110A, second surface 110B, and third surface 110C of FIG. 1. According to an embodiment, the first surface 110A may be constructed of a front plate 102 (e.g., a polymer plate or a glass plate having various coating layers) which is at least partially transparent in practice. The second surface 110B may be constructed of a back plate 111 which is opaque in practice. For example, the back plate 111 may be constructed of coated or colored glass, ceramic, polymer, metallic materials (e.g. aluminum, stainless steel (STS), or magnesium) or a combination of at least two of the these materials. The side surface 110C may be constructed of a side bezel structure (or a side member) 118 bonded to the front plate 102 and the back plate 111 and including metal and/or polymer. In some embodiments, the back plate 111 and the side bezel structure 118 may be constructed integrally and may include the same material (e.g., a metallic material such as aluminum).

According to an embodiment, the side member 118 may include an outer structure 118A constructed of a first metallic material and an inner structure (not shown) including a second metallic material different from the first metallic material. The outer structure 118A may constitute the side surface 110C, and the front plate 102 and the back plate 111 may be bonded respectively to both sides of the outer structure 118A. The inner structure may be bonded to the outer structure 118A, and may be disposed to a space between the front plate 102 and the back plate 111.

According to an embodiment, the electronic device 110 may include an internal structure (not shown) constructed of a first polymer material disposed to the space between the front plate 102 and the back plate 111 and bonded to the side member 118. The internal structure may be bonded to or in contact with the outer structure 118A, and may be bonded to an inner structure of the side member 118 via a second polymer material (not shown) or an organic adhesive layer such as a sealant.

According to an embodiment, one portion of the side member 118 may be designed to have a structure which is physically or electrically separated from the remaining portions of the side member 118 to reduce deterioration of radio frequency radiation performance of the electronic device 100 due to the side member 118. The internal structure may allow one portion of the side member 118 to remain in a state of being physically or electrically separated from the remaining portions of the side member 118. A portion 121 of the internal structure may be disposed to gaps 124 of the outer structure 118A to constitute a portion of the side surface 110C of the electronic device 100.

According to an embodiment, the electronic device 100 may include at least one or more of a display 101, audio modules 103, 107, and 114, sensor modules 104, 119, camera modules 105, 112, and 113, and key input devices 116 and 117, an indicator 106, and connector holes 108 and 109. In some embodiments, the electronic device 100 may omit at least one (e.g., the key input devices 116 and 117 or the indicator 106) of these components, or may additionally include other components.

The display 101 may be exposed through, for example, some portions of the front plate 102. The display 101 may be disposed adjacent to or bonded to a touch sensing circuit, a pressure sensor capable of measuring touch strength (pressure), and/or a digitizer for detecting a stylus pen of a magnetic field type.

The audio modules 103, 107, and 114 may include the microphone hole 103 and the speaker holes 107 and 114. The microphone hole 103 may have a microphone disposed inside thereof to acquire external sound, and in some embodiments, may have a plurality of microphones disposed to sense a sound direction. The speaker holes 107 and 114 may include the external speaker hole 107 and the communication receiver hole 114. In some embodiments, the speaker holes 107 and 114 and the microphone hole 103 may be implemented with one hole, or the speaker may be included without the speaker holes 107 and 114 (e.g., a Piezo speaker).

The sensor modules 104 and 119 may generate an electrical signal or data value corresponding to an internal operating state of the electronic device 100 or an external environmental state. The sensor modules 104 and 119 may include, for example, the first sensor module 104 (e.g., a proximity sensor) and/or second sensor module (not shown) (e.g., a fingerprint sensor) disposed to the first surface 110A of the housing 110, and/or the third sensor module 119 (e.g., an HRM sensor) disposed to the second surface 110B of the housing 110. The fingerprint sensor may be disposed not only to the first surface 110A (e.g., a home key button (not shown)) of the housing 110 but also to the second surface 110B. The electronic device 100 may further include at least one of a sensor module (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illumination sensor 104.

The camera modules 105, 112, and 113 may include the first camera device 105 disposed to the first surface 110A of the electronic device 100, the second camera device 112 disposed toe the second surface 110B, and/or the flash 113. The camera module 105 and 112 may include one or more lenses, an image sensor, and/or an image signal processor. The flash 113 may include, for example, a Light Emitting Diode (LED) or a xenon lamp. In some embodiments, two or more lenses (wide angle and telephoto lenses) and image sensors may be disposed to one surface of the electronic device 100.

The key input devices 116 and 117 may include a home key button (not shown) disposed to the first surface 110A of the housing 110, the touch pad 116 disposed around the home key button (not shown), and/or the side key button 117 disposed to the side surface 110C of the housing 110. In another embodiment, the electronic device 100 may not include some or all of the aforementioned key input devices 116 and 117. The key input devices 116 and 117, which are not included, may be implemented on the display 101 in a different form such as a soft key or the like.

The indicator 106 may be disposed to, for example, the first surface 110A of the housing 110. The indicator 106 may provide, for example, state information of the electronic device 100 in an optical form, and may include an LED.

The connector holes 108 and 109 may include the first connector hole 108 capable of accommodating a connector (e.g., a USB connector) for transmitting/receiving power and/or data of an external electronic device and/or the second connector hole (e.g., earphone jack) 109 capable of accommodating a connector for transmitting/receiving an audio signal with respect to the external electronic device.

Referring to FIG. 2, an electronic device 200 may include a first support member 300 consisting of a side bezel structure (or a side member) 210 and an internal structure 290, a front plate 220, a display 230, a printed circuit board 240, a battery 250, a second support member 260 (e.g., a back case), an antenna 270, and a back plate 280. In some embodiments, the electronic device 200 may omit at least one (e.g., the second support member 260) of these components, or may additionally include other components. At least one of the components of the electronic device 200 may be the same as or similar to at least one of the components of the electronic device 100 of FIG. 1A or FIG. 1B, and redundant descriptions will be omitted hereinafter.

Referring to FIG. 2 and FIG. 3, the side bezel structure 210 of the first support member 300 may include an outer structure 210A and an inner structure 210B constructed of a metallic material different from that of the outer structure 210A. The outer structure 210A may surround a space between the front plate 220 and the back plate 280, and the inner structure 210B may be bonded to the outer structure 210A and disposed to the space. The side bezel structure 210 may include a portion 2101 bonded to an edge region 221 of the front plate 220 and a portion 2102 bonded to an edge region 281 of the back plate 280. The front plate 22o and the back plate 280 may be bonded to the side bezel structure 210 by using an adhesive material such as a double-sided tape or the like.

The internal structure 290 may be disposed to the space between the front plate 220 and the back plate 280, and may include a polymer material bonded to the side bezel structure 210. According to an embodiment, the internal structure 290 may allow one portion 212 or 213 of the side bezel structure 210 to remain in a state of being physically or electrically separated from the remaining portions of the side bezel structure 210. A portion 2901 of the internal structure 290 may be disposed to gaps of the outer structure 210A and may be exposed to the outside. According to an embodiment, the portion 212 or 213 of the side bezel structure 210 may be used as an antenna component by being electrically coupled with the printed circuit board 240. For example, the portion 212 or 213 of the side bezel structure 210 may be used as an antenna radiator or an antenna ground. According to some embodiments, the portion 212 or 213 of the side bezel structure 210 may be designed to be in an electrically floating state.

The display 230 may be bonded to one surface of a mid-plate (or a bracket) 302 defined as an inner portion of the outer structure 210A of the first support member 300, and may be disposed between the mid-plate 302 and the front plate 220. The printed circuit board 240 may be bonded to the other surface of the mid-plate 302, and may be disposed between the mid-plate 302 and the back plate 280. A processor, a memory, and/or an interface may be mounted on the printed circuit board 240. The processor may include, for example, one or more of a central processing unit, an application processor, a graphic processing unit, an image signal processor, a sensor hub processor, and a communication processor. The memory may include, for example, a volatile memory or a non-volatile memory. The interface may include, for example, a High Definition Multimedia Interface (HDMI), a Universal Serial Bus (USB) interface, an SD card interface, and/or an audio interface. For example, the interface may electrically or physically couple the electronic device 300 and the external electronic device, and may include a USB connector, an SD card/MMC connector, or an audio connector.

A first interface between the outer structure 210A and the internal structure 290, a second interface between the outer structure 210A and the inner structure 210B, and a third interface between the inner structure 210B and the internal structure 290 may be constructed due to bonding of the outer structure 210A, the inner structure 210B, and the internal structure 290. Each of the first interface, the second interface, and the third interface may have different bonding force (or joining force). The 'bonding force of the interface' may be defined as mechanical strength indicating resistive force for a damage caused by external force or environmental strength indicating resistive force for a damage caused by environments (water, heat, etc.). According to an embodiment, the third interface may be designed such that an organic adhesive layer such as a sealant or the like is disposed, and bonding force is higher than that of the first interface. For example, a first polymer material of the internal structure 290 may be more firmly joined to the inner structure 210B constructed of a second metallic material in comparison with the outer structure 210A constructed of a first metallic material. According to some embodiments, the third interface may be designed to have bonding force higher or lower than that of the second interface.

Returning to FIG. 1A and FIG. 1B, when assuming that a gap is constituted in a joining portion 122 of the side member 118 and an edge region of the front plate 102 or a joining portion 123 of the side member 118 and an edge region of the back plate 111 due to external force or environments, a foreign matter such as water or the like is introduced into this gap but is no longer able to flow into the electronic device 100 due to the first interface, second interface, or third interface which maintains bonding force.

Returning to FIG. 1A and FIG. 1B, when assuming that the first interface (e.g., a first interface 124) is separated by the external force or environments to constitute a gap, a foreign matter such as water or the like is introduced into this gap but is no longer able to flow into the electronic device 100 due to the second interface or third interface which maintains bonding force. When assuming that the first interface and the second interface are separated by the external force or environments to constitute a gap, a foreign matter such as water or the like is introduced into this gap but is no longer able to flow into the electronic device 100 due to the third interface which maintains bonding force.

As a device for supplying power to at least one component of the electronic device 200, the battery 250 may include, for example, a non-rechargeable primary cell, a rechargeable secondary cell, or a fuel cell. At least one portion of the battery 250 may be disposed on the same plane substantially with respect to, for example, the printed circuit board 240. The battery 250 may be disposed integrally inside the electronic device 100, or may be detachably disposed with respect to the electronic device 200.

The second support member 260 may be bonded to the first support member 300, and may be disposed between the printed circuit board 240 and the back plate 280. The second support member 260 may be bonded to the first support members 210 and 220 through bolt fastening or the like together with the printed circuit board 240, and may cover the printed circuit board 240 to protect it.

The antenna 270 may be disposed between the back plate 280 and the battery 250. The antenna 270 may include, for example, a Near Field Communication (NFC) antenna, a wireless charging antenna, and/or a Magnetic Secure Transmission (MST) antenna. The antenna 270 may perform short-range communication, for example, with the external electronic device, or may wirelessly transmit/receive power required for charging. In another embodiment, an antenna structure may be constructed by at least one portion of the first support member 311. For example, the portion 212 or 213 of the side bezel structure 210 may be used as an antenna radiator or an antenna ground.

According to various embodiments, the electronic device 200 may further include various elements (or modules) depending on a type of providing them. The components may be modified in various manners along with the convergence trend of digital devices, and thus not all of the components may be listed herein. However, components of the same level as that of the aforementioned components may be further included in the electronic device 200. In the electronic device 200 according to various embodiments, it is apparent that specific components may be excluded from the aforementioned components or replaced with other components.

Figure 4A:
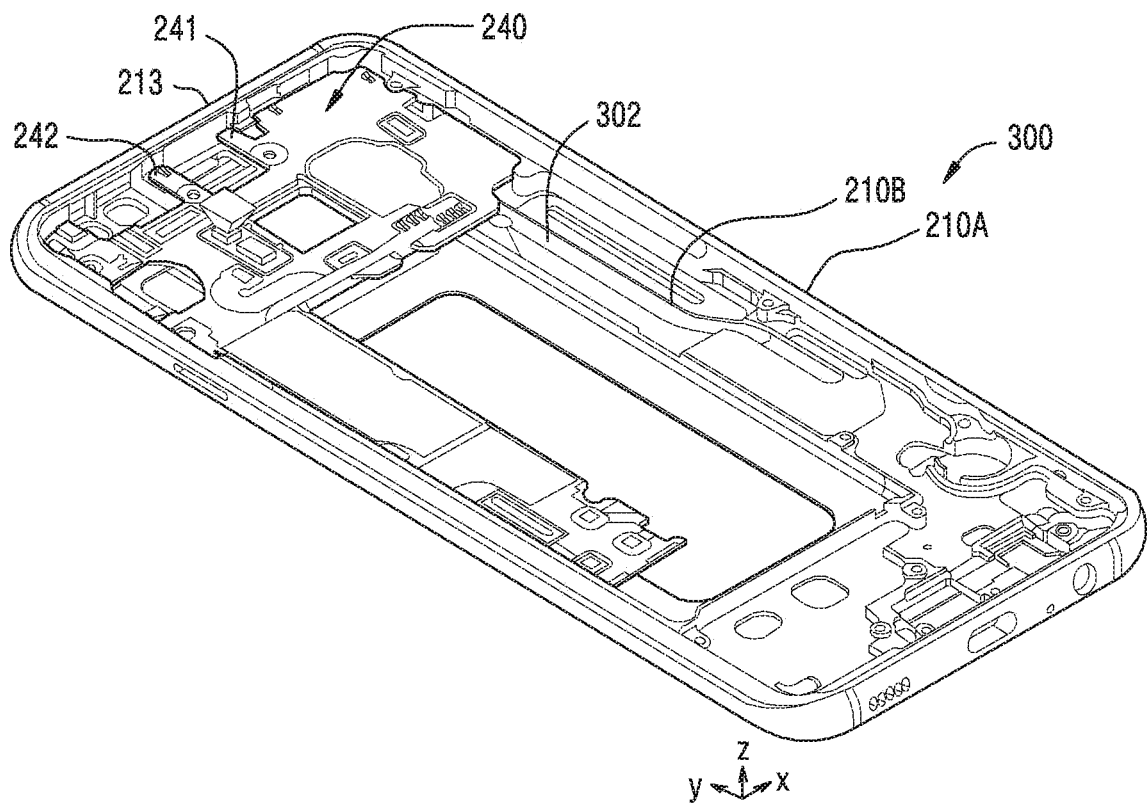
FIG. 4A and FIG. 4B illustrate a bonding state of a first support member and a printed circuit board according to an embodiment.
Figure 4B:
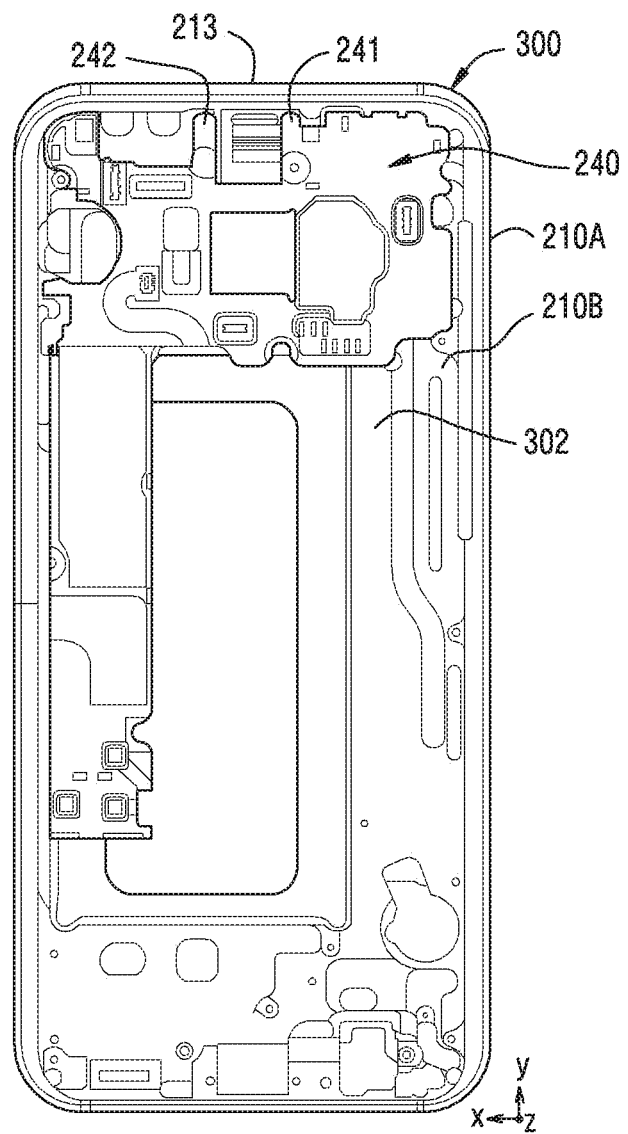
Figure 4C:
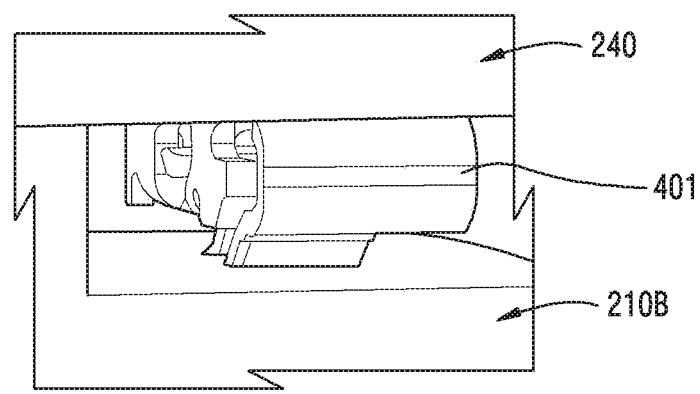
FIG. 4C illustrates an electrical connection structure of a support member and a printed circuit board according to an embodiment.

FIG. 4A and FIG. 4B illustrate a bonding state of a first support member and a printed circuit board according to an embodiment. FIG. 4C illustrates an electrical connection structure of a support member and a printed circuit board according to an embodiment.

Referring to FIG. 4A and FIG. 4B, the printed circuit board 240 may be bonded to the mid-plate 302 of the first support member 300. A portion 241 or 242 of the printed circuit board 240 may be electrically coupled with the first support member 300. According to an embodiment, the portion 242 or 242 of the printed circuit board 240 may be electrically coupled with the portion (hereinafter, metal piece) 213 constructed as a portion of the outer structure 210A and a portion of the inner structure 210B.

Referring to FIG. 4C, a flexible conductive member such as a C-clip 401, a pogo-pin, a spring, a conductive poron and rubber, a conductive tape, a cooper connector, or the like may be disposed between the printed circuit board 240 and the inner structure 210B. The printed circuit board 240 may be electrically coupled with the metal piece 213 via the flexible conductive member, and the metal piece 213 may be used as an antenna radiator or antenna ground for wireless communication.

The printed circuit board 240 may include one or more wireless communication circuits (or modules) which support to establish a wireless communication channel with respect to the external electronic device and to perform communication via the established communication channel. According to various embodiments, the wireless communication circuits may include a cellular communication circuit, a short-range wireless communication module, a Global Navigation Satellite System (GNSS) communication module, or the like. For example, the cellular communication circuit may be, for example, at least one of Long-Term Evolution (LTE), LTE Advance (LTE-A), Code Division Multiple Access (CDMA), Wideband CDMA (WCDMA), Universal Mobile Telecommunications System (UMTS), Wireless Broadband (WiBro), Global System for Mobile Communications (GSM), and the like. For example, the short-range wireless communication circuit may include at least one of Wireless Fidelity (WiFi), Light Fidelity (LiFi), Bluetooth, Bluetooth Low Energy (BLE), Zigbee, Near Field Communication (NFC), magnetic secure transmission, Radio Frequency (RF), and Body Area Network (BAN). For example, the GNSS communication circuit may be a Global Positioning System (GPS), Global Navigation Satellite System (Glonass), Beidou Navigation Satellite System (hereinafter, "Beidou"), or Galileo, the European global satellite-based navigation system. Several types of wireless communication circuits may be implemented as a single chip or respective separate chips.

The wireless communication circuits may include one or more communication processors that are operable independently from a processor such as an application processor and support wireless communication. According to an embodiment, the wireless communication circuits may transmit a signal to the external electronic device via an antenna radiator such as the metal piece 213, or may receive the signal from the external electronic device. According to an embodiment, the metal piece 213 may be used in a first network (e.g., Bluetooth, Wireless-Fidelity (Wi-Fi) direct, or Infrared Data Association (IrDA)) or a second network (e.g., a cellular network, the Internet, or a computer network (e.g., Local Area Network (LAN) or Wide Area Network (WAN)).

According to some embodiments, leakage current may flow to the first support member 300. The leakage current may flow to a human body of a user who carries the electronic device through the outer structure 210A. The leakage current may cause reactions (or symptoms) of the human body, such as discomfort, pain, muscle spasms, burns, lethality, or the like. For example, the electronic device may charge a battery by using power supplied from an external power device such as a charging device or the like. Unintended high-voltage Alternating Current (AC) current may be supplied from the external power device to the electronic device due to a defect or breakage of the external power device. The high-voltage AC current may be leaked to the first support member 300. Although the side member 210 may be designed to include an insulating material coated on a surface thereof, AC current may flow through the insulating material because a potential difference thereof fluctuates. For another example, unintended Direct Current (DC) over-current output from the electronic device may be leaked to the first support member 300. When the outer structure 210A is aged or broken such as peeling of the insulating material due to aging or a breakage, there is a high possibility that the leakage current flows to the human body. According to some embodiments, another portion of the first support member 300 may be electrically coupled with a leakage current cutoff circuit by utilizing the electrical connection structure of FIG. 4C. The leakage current cutoff circuit may electrically couple the first support member 300 and a ground of the printed circuit board 240, and may prevent leakage current from flowing from the ground of the printed circuit board 240 to the first support member 300. The leakage current cutoff circuit may be designed to convert high-current AC input through a connector to low-current AC or remove it. The leakage current cutoff circuit may be designed to convert high-current AC input through the connector to low-current AC or remove it. The leakage current cutoff circuit may be designed to convert high-current AC input through the connector to low-current DC or remove it. The leakage current cutoff circuit may be designed to convert high-voltage AC input through the connector to low-current DC or remove it.

Figure 5:
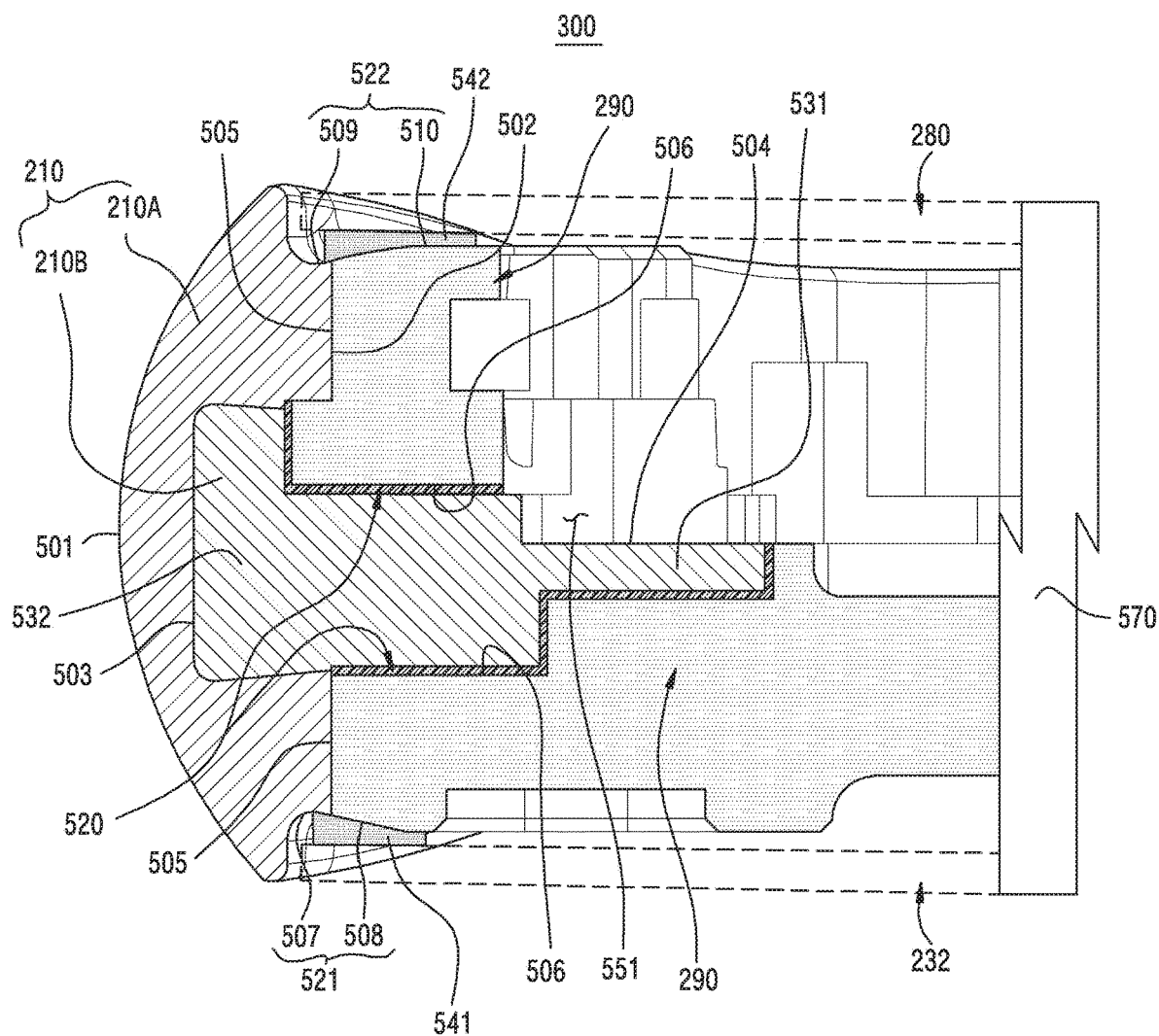
FIG. 5 and FIG. 6 are cross-sectional views for a portion of a first support member according to an embodiment.

FIG. 5 is a cross-sectional view for a portion of a first support member according to an embodiment. The cross-sectional view of FIG. 5 may correspond to a y-z or x-z cross-section of the first support member 300 of FIG. 3.

Referring to FIG. 5, the first support member 300 may include the side member 210 and the internal structure 290.

The side member 210 may include the outer structure 210A constructed of a first metallic material and the inner structure 210B constructed of a second metallic material different from the first metallic material. The outer structure 210A may include at least one first surface 501 constructing an outer surface of the side member 210 and at least one second surface 502 facing a space 570 surrounded by the outer structure 210A. The inner structure 210B may include at least one third surface 503 at least partially in contact with the second surface 502 of the outer structure 210A and at least one fourth surface 504 facing the space 502.

The second surface 502 of the outer structure 210A may provide a space having a groove shape, and the inner structure 210B may include a portion 532 which fits into this space. According to an embodiment, a bonding structure of the outer structure 210A and the inner structure 210B may include a dovetail joint. The bonding structure between the outer structure 210A and the inner structure 210B may be designed in various shapes in which it is difficult to separate them from one another.

The internal structure 290 may include a first polymer material disposed to the space 502 adjacent to the side member 210. The internal structure 290 may include at least one fifth surface 505 at least partially in contact with the second surface 502 of the outer structure 210A. According to some embodiments, an organic adhesive layer disposed between the second surface 502 and the fifth surface 505 may be provided. The internal structure 290 may include at least one sixth surface 506 bonded to the fourth surface 504 of the inner structure 210B. According to an embodiment, the first support member 300 may include an organic adhesive layer 520 such as a sealant disposed between the fourth surface 504 of the inner structure 210B and the sixth surface 506 of the internal structure 290. According to an embodiment, the organic adhesive layer 520 may include triazine thiol, dithio pyrimidine, silane-based compounds, or the like.

According to an embodiment, a first polymer material of the internal structure 290 may include polymer resin such as PolyEther Ether Ketone (PEEK), PolyPhenylene Sulfide (PPS)), PolyButylene Terephthalate (PBT), PolyImide (PI), PolyCarbonate (PC)), or the like.

A first interface between the second surface 502 of the outer structure 210A and the fifth surface 505 of the internal structure 290, a second interface between the second surface 502 of the outer structure 210A and the third surface 503 of the inner structure 210B, and a third interface between the fourth surface 504 of the internal structure 210B and the sixth surface 506 of the inner structure 290 may be constituted due to bonding of the outer structure 210A, the inner structure 210B, and the internal structure 290. The first interface, the second interface, and the third interface may be designed to have different bonding force. According to an embodiment, the third interface may be designed to have the organic adhesive layer 520 disposed thereon and to have bonding force higher than that of the first interface. For example, the first polymer material of the internal structure 290 may be more strongly joined to the inner structure 210B constructed of the second metallic material than the outer structure 210A constructed of the first metallic material. According to some embodiments, the third interface may be designed to have bonding force higher or lower than that of the second interface.

According to an embodiment, the side member 210 may be designed as the outer structure 210A and the inner structure 210B, thereby reducing restriction of the first metallic material constituting the outer structure 210A. Since the inner structure 210B is constructed of the second metallic material having higher bonding force with respect to the first polymer material of the internal structure 290 via the organic adhesive layer 520 in comparison with the outer structure 210A, the outer structure 210A may be designed with various first metallic materials which do not need to prioritize the bonding force with respect to the first polymer material of the internal structure 290. For example, the outer structure 210A may be constructed of various first metallic materials having a corrosion resistance property and an aesthetic property in design rather than the bonding force with respect to the internal structure 290. On the contrary, although not shown, if it is assumed that the side member bonded to the internal structure 290 is designed integrally with a single metallic material, for waterproofing, there may be a constraint that the side member 210 must be constructed of a metallic material which focuses on the bonding force with respect to the first polymer material of the internal structure 290.

The first support member 300 may include a first mounting portion 521 which is a portion in which an edge region of a front plate 232 is bonded via the adhesive material 541 such as a double-sided tape. The first mounting portion 521 may include a seventh surface 507 of the outer structure 210A and an eighth surface 508 of the internal structure 290, and may provide a fitting-type space to which the edge portion of the front plate 232 can be mounted. The adhesive material 541 may be disposed to cover the seventh surface 507 and the eighth surface 508. According to some embodiments, the adhesive material 541 may be designed to cover only one of the seventh surface 507 and the eighth surface 508. The adhesive material 541 may prevent a foreign matter such as water or the like from flowing into the space 570.

The first support member 300 may include a second mounting portion 522 which is a portion in which an edge region of the back plate 280 is bonded via the adhesive material 542 such as a double-sided tape. The second mounting portion 522 may include a ninth surface 509 of the outer structure 210A and a tenth surface 510 of the internal structure 290, and may provide a fitting-type space to which the edge region of the back plate 280 can be mounted. The adhesive material 542 may be disposed to cover the ninth surface 509 and the tenth surface 510. According to some embodiments, the adhesive material 542 may be designed to cover only one of the ninth surface 509 and tenth surface 510 of the internal structure 290. The adhesive material 542 may prevent a foreign matter such as water or the like from flowing into the space 570.

When it is assumed that a gap is constituted between the first mounting portion 521 and the front plate 232 or between the second mounting portion 522 and the back plate 280 due to external force or environments, a foreign matter such as water or the like enters to this gap but is no longer able to flow to the space 570 due to the first, second, or third interface which maintains bonding force. When it is assumed that a gap is constituted since the first interface is separated due to the external force or environments, a foreign matter enters this gap but is no longer able to flow to the space 570 due to the second or third interface which maintains bonding force. When it is assumed that the gap is constituted since the first and second interfaces are separated due to the external force or environments, a foreign matter such as water or the like enters this gap but is no longer able to flow to the space 570 due to the third interface which maintains bonding force.

According to some embodiments, if the inner structure 210B is designed with a second metallic material having a specific gravity lower than that of the first metallic material of the outer structure 210A, weight can be decreased in comparison with a side member (not shown) integrally constructed of the first metallic material.

According to some embodiments, if the outer structure 210A is constructed of a difficult-to-cut material such as Steel Use Stainless (SUS) and titanium, the inner structure 210B may be designed with the second metallic material of which processing is easier than that. Thus, processing may be easier than that of a side member (not shown) constructed integrally with the difficult-to-cut material.

According to some embodiments, the inner structure 210B may be constructed of the second metallic material having thermal conductivity or electrical conductivity higher than that of the first metallic material of the outer structure 210A.

According to an embodiment, the first metallic material of the outer structure 210A may include titanium, an amorphous alloy, a ceramic material, stainless steel, SUS, or the like, and the second metallic material of the inner structure 210B may include magnesium, a magnesium alloy, aluminum, an aluminum alloy, or the like. The outer structure 210A or the inner structure 210B may be constructed of a metallic material having various properties such as mechanical strength, chemical durability, or the like.

As shown in FIG. 4C, the inner structure 210B may include a portion 531 which is electrically coupled with the printed circuit board via a flexible conductive member.

According to an embodiment, the inner structure 210B may include a through-hole 551, and the flexible conductive member may be disposed to the through-hole 551. A metal piece (e.g., the metal piece 212 or 213 of FIG. 2) including a portion of the outer structure 210A and a portion of the inner structure 210B may be electrically coupled with the printed circuit board and thus may be used as an antenna radiator or antenna ground for wireless communication.

Figure 6:
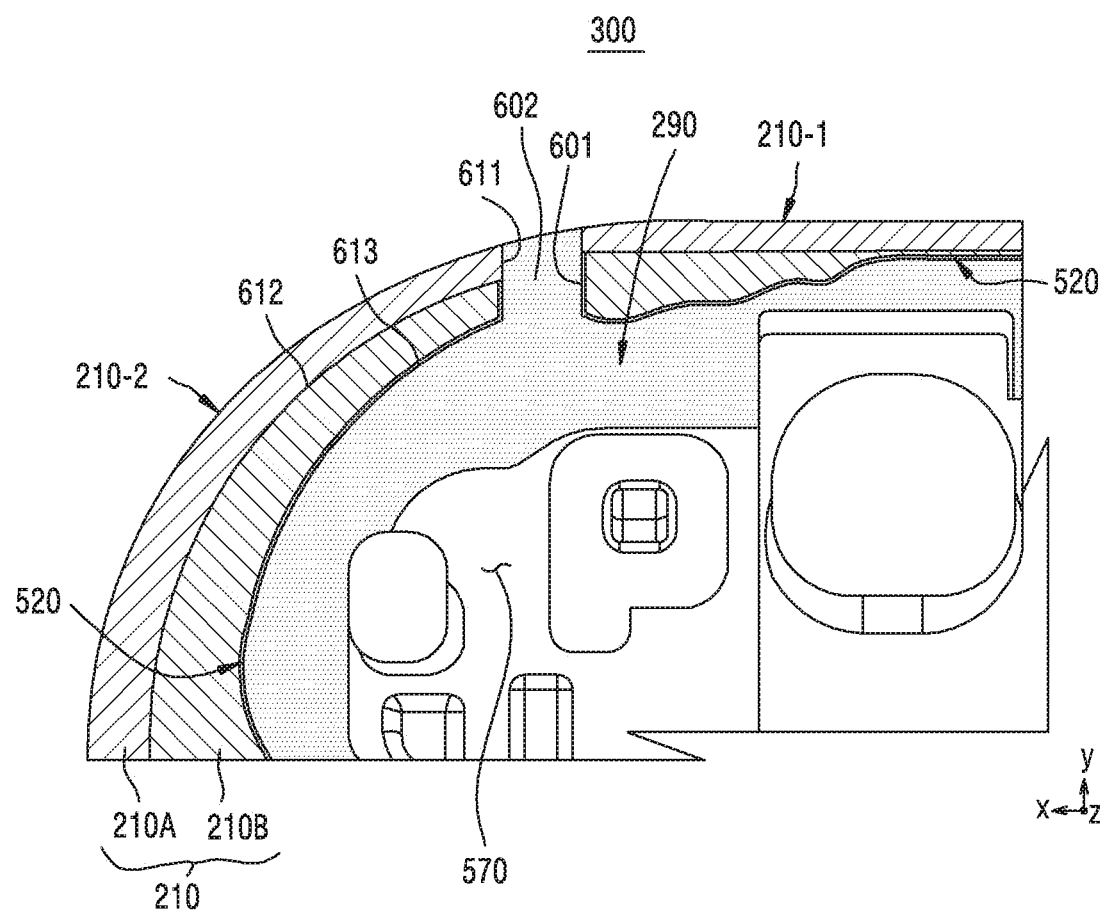

FIG. 6 is a cross-sectional view of a portion of a first support member according to an embodiment. The cross-sectional view of FIG. 6 may correspond to an x-y cross-section of the first support member 300 of FIG. 3. It may be the same as or similar to at least one of the components of the first support member 300 of FIG. 6, and redundant descriptions will be omitted hereinafter.

Referring to FIG. 6, the side member 210 may include a gap 601, and a portion 602 of the internal structure 290 may be disposed to the gap 601 to constitute an outer surface of the first support member together with the outer structure 210A. The internal structure 290 may remain in a state in which one portion 210-1 and the other portion 210-2 of the side member 210 are physically or electrically separated. According to an embodiment, the portion 210-1 of the side member 210 may be electrically coupled with a printed circuit board and thus may be used as an antenna radiator or antenna ground for wireless communication.

A first interface 611 between the outer structure 210A and the internal structure 290, a second interface 612 between the outer structure 210A and the inner structure 210B, and a third interface 613 between the inner structure 210B and the internal structure 290 may be constructed. According to an embodiment, the third interface 613 may be designed such that the organic adhesive layer 520 such as a sealant or the like is disposed, and bonding force is higher than that of the first interface 611. For example, a first polymer material of the internal structure 290 may be more strongly joined to the inner structure 210B constructed of a second metallic material in comparison with the outer structure 210A constructed of a first metallic material. According to an embodiment, the organic adhesive layer 520 may provide a strong and hermetic adhesion between the metallic member and the non-conductive material. The organic adhesive layer 520 may include a variety of materials which provide bonding force to ensure hermeticity between the metallic inner structure 210B and the first polymer material for constituting the internal structure 290. According to some embodiments, the third interface 613 may be designed to have bonding force higher or lower than that of the second interface 612.

When it is assumed that a gap is constituted since the first interface 611 is separated due to the external force or environments, a foreign matter enters this gap but is no longer able to flow to the space 570 due to the second 612 or third interface 613 which maintains bonding force. When it is assumed that the gap is constituted since the first and second interface 612s are separated due to the external force or environments, a foreign matter such as water or the like enters this gap but is no longer able to flow to the space 570 due to the third interface 613 which maintains bonding force.

Figure 7:
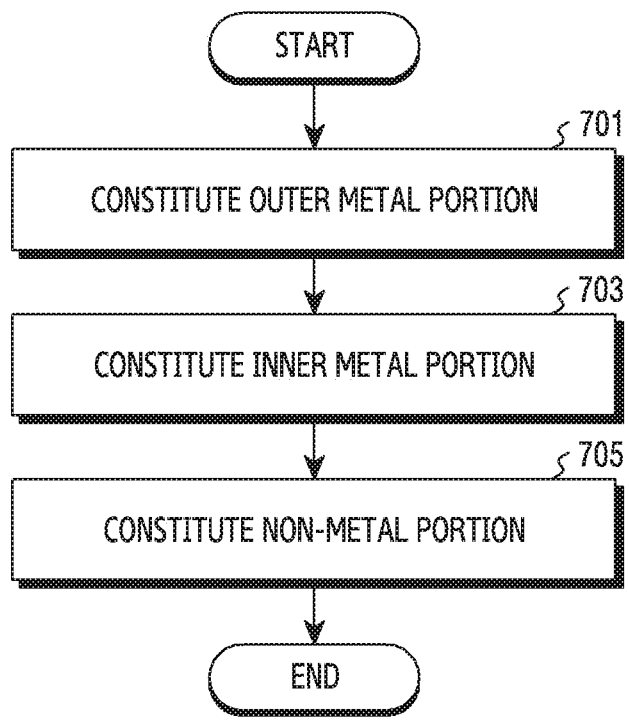
FIG. 7 is a flowchart for producing a first support member according to an embodiment.

FIG. 7 is a flowchart for producing a first support member according to an embodiment. FIG. 8A to FIG. 8E are drawings for explaining the flow of FIG. 7 according to an embodiment. The flow of FIG. 7 will be described with reference to FIG. 8A to FIG. 8E.

Figure 8A:
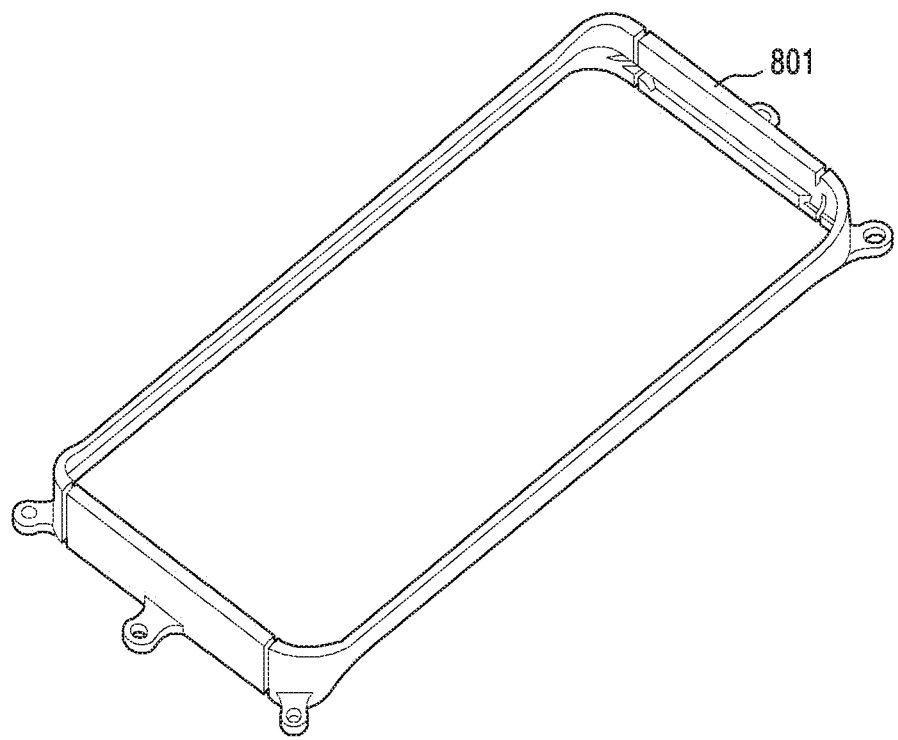
FIG. 8A to FIG. 8E are drawings for explaining the flow of FIG. 7 according to an embodiment.

In operation 701, an outer metal portion 801 of FIG. 8A may be constructed. The outer metal portion 801 may have a substantially rectangular ring shape, and may be constructed through various processing methods such as Computer Numerical Control (CNC), die casting, pressing, or the like.

Figure 8B:
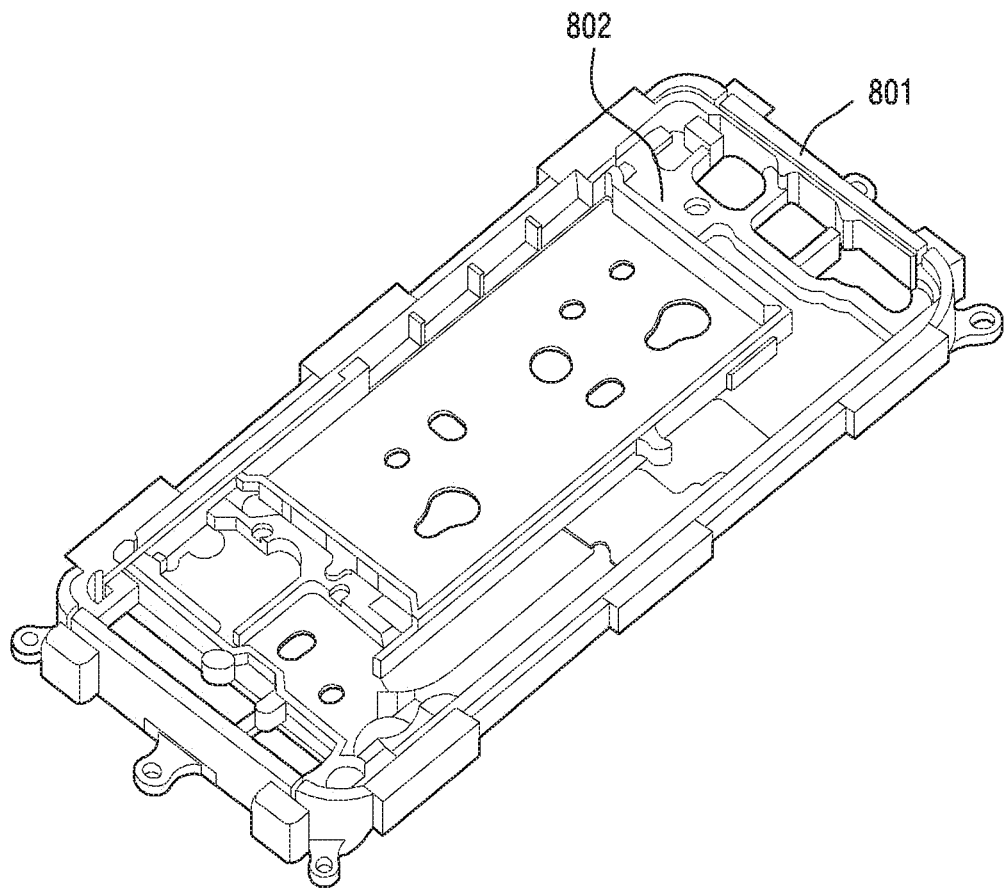

In operation 703, an inner metal portion 802 of FIG. 8B bonded to the outer metal portion 801 may be constructed. According to an embodiment, the inner metal portion 802 may be constructed inside the outer metal portion 801 by using a metallic material different from that of the outer metal portion 801 through casting or the like. According to an embodiment, in order to prevent the outer metal portion 801 and the inner metal portion 802 from being separated by external impact such as a drop or the like, a bonding structure of the outer metal portion 801 and the inner metal portion 802 may be designed in various interlocking structures such as a dovetail joint or the like. According to some embodiments, a metallic or non-metallic adhesive layer may be added to an interface between the outer metal portion 801 and the inner metal portion 802 to increase the bonding force between the outer metal portion 801 and the inner metal portion 802. According to some embodiments, after the outer metal portion 801 is constructed, a laser, a scratcher, or the like may be used to cut a surface of the outer metal portion 801, thereby increasing adhesive force for a metallic material for constructing the inner metal portion 802.

Figure 8C:
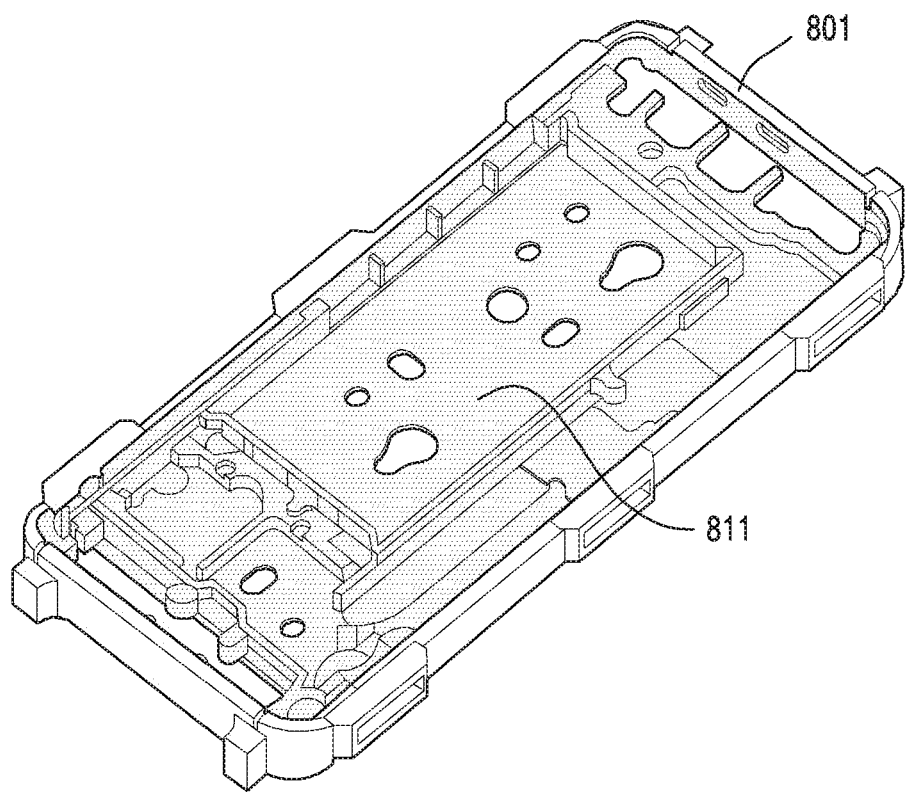
Figure 8D:
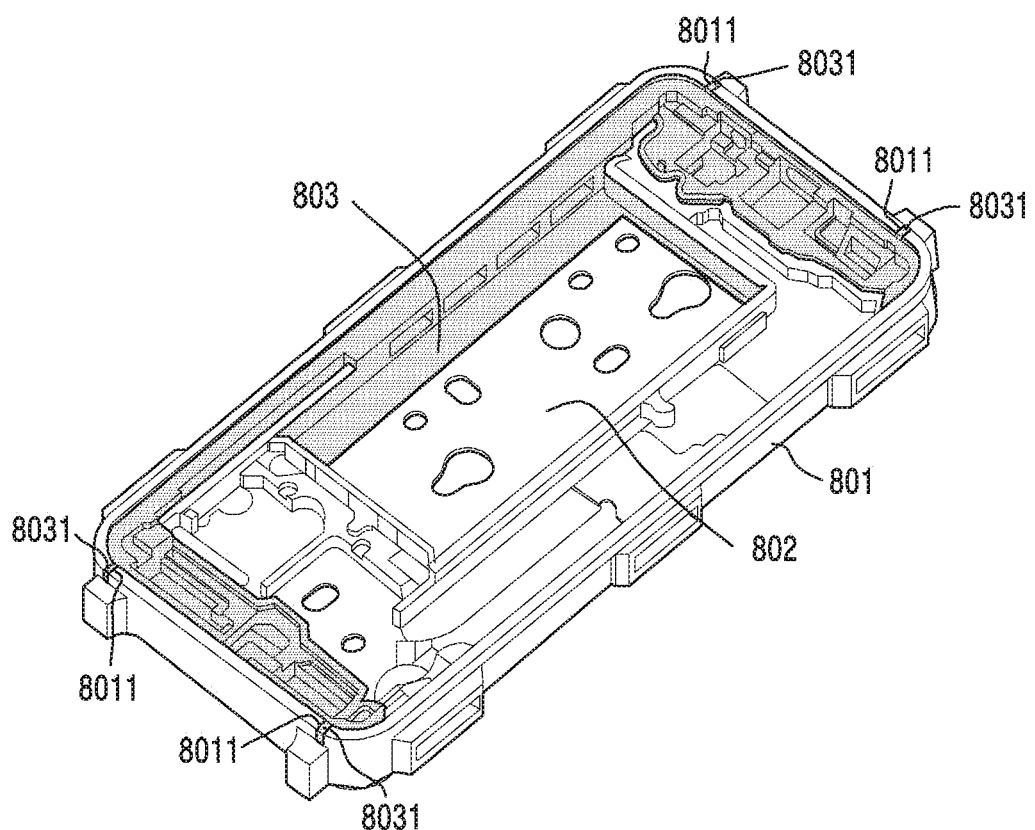
Figure 8E:
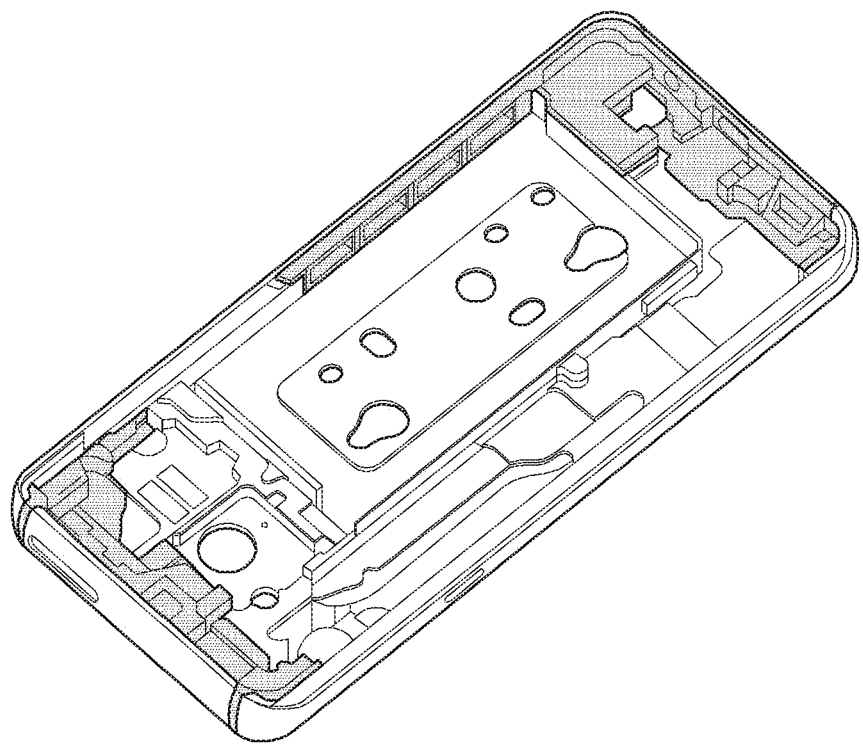

In operation 705, a non-metal portion bonded to a structure consisting of the outer metal portion 801 and the inner metal portion 802 may be constructed. Referring to FIG. 8B and FIG. 8C, a second polymer material 811 such as a triazine thiol, dithio pyrimidine, or silane-based compound may be coated on the inner metal portion 802. According to an embodiment, the inner metal portion 802 may be constructed of a metallic material having higher bonding force with respect to the second polymer material 811 in comparison with the outer metal portion 801. Referring to FIG. 8C and FIG. 8D, a non-metal portion 803 of the first polymer material may be constructed which is bonded to a surface coated with the second polymer material 811 through insert injection. A portion 8031 of the non-metal portion 803 may be disposed to gaps 8011 of the outer metal portion 801. Referring to FIG. 8D and FIG. 8E, a support member 800 such as the first support member 300 of FIG. 5 may be constructed through post-processing such as cutting, polishing, surface treatment (e.g., deposition, anodizing, painting, etc.). Returning to FIG. 5, the outer structure 210A may be constructed by the outer metal portion 801 of FIG. 8B, and the inner structure 210B may be constructed by the inner metal portion 802 of FIG. 8B. In addition, the organic adhesive layer 520 may be constructed by the second polymer material 811 of FIG. 8C, and the internal structure 290 may be constructed by the non-metal portion 803 of the first polymer material of FIG. 8D.

According to an embodiment of the present disclosure, the electronic device 200 may include the front plate 232, the back plate 280 facing a direction opposite to the front plate 232, and the side member 210 surrounding the space 570 between the front plate 232 and the back plate 280, constructed integrally with respect to the back plate 280, or bonded to the back plate 210. The side member 210 may include the outer structure 210A constructed of a first metallic material and including at least one first surface 501 constructing an outer surface of the side member 210 and at least one second surface 502 facing the space 570. The side member 210 may include the inner structure 210B constructed of a second metallic material different from the first metallic material and including at least one third surface 503 at least partially in contact with the second surface 502 and at least one fourth surface 504 facing the space 570. The electronic device 200 may include the touch screen display 230 exposed through the front plate 232. The electronic device 200 may include the internal structure 290 disposed to the space 570 so as to be adjacent to the side member 210, constructed of a first polymer material, and including at least one fifth surface 505 at least partially in contact with the second surface 502. The electronic device 200 may include a wireless communication circuit electrically coupled with a portion of the inner structure 210B. The electronic device 200 may include the sealant 520 disposed between the fourth surface 504 and at least one sixth surface 506 of the internal structure 290.

According to an embodiment of the present disclosure, the first metallic material may include at least one of stainless steel and Steel Use Stainless (SUS). The second metallic material may include at least one of aluminum and an aluminum alloy.

According to an embodiment of the present disclosure, the sealant may include a second polymer material.

According to an embodiment of the present disclosure, the internal structure 290 may include the through-hole 551. The electronic device 200 may include the flexible conductive member 401 at least partially disposed to the through-hole 551 and in contact with the portion 531 of the inner structure 210B.

According to an embodiment of the present disclosure, the outer structure 210A and inner structure 210B of the side member 210 may be bonded in a dovetail joint manner.

According to an embodiment of the present disclosure, the side member 210 may include a plurality of portions physically separated.

According to an embodiment of the present disclosure, the internal structure 290 may include a portion constituting an outer surface of the electronic device by being disposed to a gap constituted between the plurality of physically separated portions of the side member 210.

According to an embodiment of the present disclosure, the front plate 232 and the back plate 280 may be bonded via the inner structure 290 and the adhesive materials 541 and 542.

According to an embodiment of the present disclosure, the electronic device 200 may further include a conductive adhesive layer disposed between the second surface 502 of the outer structure 210A and the third surface 503 of the inner structure 210B.

According to an embodiment of the present disclosure, the second metallic material has thermal conductivity or electrical conductivity higher than that of the first metallic material.

According to an embodiment of the present disclosure, the second metallic material has a specific gravity lower than that of the first metallic material.

According to an embodiment of the present disclosure, the electronic device 200 may include the front plate 232 and the back plate 280 facing a direction opposite to the front plate 232. The electronic device 200 may include the outer structure 210A surrounding a space between the front plate 232 and the back plate 280, and including a plurality of first gaps and a plurality of portions physically separated by the first gaps. The electronic device 200 may include the inner structure 210B disposed to the space 570 according to the outer structure 210A, and including second gaps aligned with the first gaps and a plurality of portions physically separated by the second gaps. The electronic device 200 may include the non-metallic internal structure 290 bonded to the inner structure 210B in the space 570, and including the first gaps and a portion 602 disposed to the second gaps to constitute an outer surface of the electronic device 200. The electronic device 200 may include the organic adhesive layer 520 disposed between the inner structure 210B and the internal structure 290. The electronic device 200 may include a display disposed to the space 570 and exposed through the front plate 232. The outer structure 210A and the inner structure 210B may be constructed of different metallic materials.

According to an embodiment of the present disclosure, the electronic device 200 is an electronic device further including a wireless communication circuit electrically coupled with the inner structure 210B.

According to an embodiment of the present disclosure, the electronic device 200 may further include the printed circuit board 240 disposed to the space 570 and having the wireless communication circuit mounted thereon, and the flexible conductive member 401 disposed between the printed circuit board 240 and the inner structure 210B.

According to an embodiment of the present disclosure, the outer structure 210A and the inner structure 210B may be bonded in a fitting manner.

According to an embodiment of the present disclosure, the outer structure 210A may include titanium, an amorphous alloy, a ceramic material, stainless steel, or SUS, and the inner structure 210B may include at least one of magnesium, a magnesium alloy, aluminum, an aluminum alloy, a zinc alloy, and a copper alloy.

According to an embodiment of the present disclosure, the internal structure 290 may include at least one of polyether ether ketone, polyphenylene sulfide, polybutylene terephthalate, polyimide, and polycarbonate.

According to an embodiment of the present disclosure, the organic adhesive layer may include at least one of triazine thiol, dithio pyrimidine, and silane-based compound.

While the present disclosure has been shown and described with reference to exemplary embodiments thereof, it will be understood by those skilled in the art that various changes in form and details may be made therein without departing from the spirit and scope of the present disclosure as defined by the appended claims and their equivalents. Therefore, it shall be considered that the disclosed embodiments are provided not for a restrictive purpose but for an illustrative purpose. The scope of the disclosure is defined not by the detailed description of the disclosure but by the appended claims and their equivalents, and all differences within the scope will be construed as being included in the present disclosure.

What is claimed is:

1. An electronic device comprising:
 a front plate;
 a back plate facing a direction opposite to the front plate;
 a side member surrounding a space between the front plate and the back plate, constructed integrally with respect to the back plate, or bonded to the back plate, wherein the side member comprises:
  an outer structure constructed of a first metallic material and comprising at least one first surface constructing an outer surface of the side member and at least one second surface facing the space, and
  an inner structure constructed of a second metallic material different from the first metallic material and comprising at least one third surface at least partially in contact with the second surface and at least one fourth surface facing the space,
 wherein the inner structure is entirely disposed inside the space without being exposed to outside of the electronic device, and partially surrounded by the outer structure on three sides;
a touch screen display exposed through the front plate;
an internal structure disposed to the space so as to be adjacent to the side member, constructed of a first polymer material, and comprising at least one fifth surface at least partially in contact with the second surface;
a wireless communication circuit electrically coupled with a portion of the inner structure; and
a sealant disposed between the fourth surface and at least one sixth surface of the internal structure.

2. The electronic device of claim 1,
wherein the first metallic material comprises at least one of stainless steel or steel use stainless (SUS), and
wherein the second metallic material comprises at least one of aluminum or an aluminum alloy.

3. The electronic device of claim 1, wherein the sealant comprises a second polymer material.

4. The electronic device of claim 1,
wherein the internal structure comprises a through-hole, and
wherein the electronic device comprises a flexible conductive member at least partially disposed to the through-hole and in contact with the portion of the inner structure.

5. The electronic device of claim 1, wherein the outer structure and inner structure of the side member are bonded in a dovetail joint manner.

6. The electronic device of claim 1, wherein the side member comprises a plurality of portions physically separated.

7. The electronic device of claim 6, wherein the internal structure comprises a portion constituting an outer surface of the electronic device by being disposed to a gap constituted between the plurality of portions physically separated.

8. The electronic device of claim 1, wherein the front plate and the back plate are bonded via the inner structure and an adhesive material.

9. The electronic device of claim 1, further comprising a conductive adhesive layer disposed between a second surface of the outer structure and a third surface of the inner structure.

10. The electronic device of claim 1, wherein the second metallic material has thermal conductivity or electrical conductivity higher than that of the first metallic material.

11. The electronic device of claim 1, wherein the second metallic material has a specific gravity lower than that of the first metallic material.

12. The electronic device of claim 1, wherein the sealant comprises at least one of triazine thiol, dithio pyrimidine, or silane-based compound.

13. The electronic device of claim 1, wherein the internal structure comprises at least one of polyether ether ketone, polyphenylene sulfide, polybutylene terephthalate, polyimide, or polycarbonate.

14. The electronic device of claim 1, wherein the outer structure comprises a plurality of gaps and a plurality of portions physically separated by the plurality of gaps.

15. The electronic device of claim 14, wherein the inner structure comprises a portion constituting an outer surface of the electronic device by being disposed between the plurality of gaps.

16. An electronic device comprising:
a front plate;
a back plate facing a direction opposite to the front plate;
an outer structure surrounding a space between the front plate and the back plate, and comprising a plurality of first gaps and a plurality of portions physically separated by the first gaps;
an inner structure disposed to the space according to the outer structure, and comprising second gaps aligned with the first gaps and a plurality of portions physically separated by the second gaps;
a non-metallic internal structure bonded with the inner structure in the space, and comprising the first gaps and a portion disposed to the second gaps to constitute an outer surface of the electronic device;
an organic adhesive layer disposed between the inner structure and the internal structure; and
a display disposed to the space and exposed through the front plate,
wherein the outer structure and the inner structure are constructed of different metallic materials.

17. The electronic device of claim 16, further comprising a wireless communication circuit electrically coupled with the inner structure.

18. The electronic device of claim 17, further comprising:
a printed circuit board disposed to the space and having the wireless communication circuit mounted thereon; and
a flexible conductive member disposed between the printed circuit board and the inner structure.

19. The electronic device of claim 16, wherein the outer structure and the inner structure are bonded in a fitting manner.

20. The electronic device of claim 16, wherein the outer structure comprises titanium, an amorphous alloy, a ceramic material, stainless steel, or steel use stainless (SUS), and the inner structure comprises at least one of magnesium, a magnesium alloy, aluminum, an aluminum alloy, a zinc alloy, or a copper alloy.

* * * * *